(12) United States Patent
Kitajima

(10) Patent No.: US 11,056,369 B2
(45) Date of Patent: Jul. 6, 2021

(54) SUBSTRATE HOLDING APPARATUS

(71) Applicant: SHINKO ELECTRIC INDUSTRIES CO., LTD., Nagano (JP)

(72) Inventor: Masakuni Kitajima, Nagano (JP)

(73) Assignee: SHINKO ELECTRIC INDUSTRIES CO., LTD., Nagano (JP)

(*) Notice: Subject to any disclaimer, the term of this patent is extended or adjusted under 35 U.S.C. 154(b) by 149 days.

(21) Appl. No.: 16/292,917

(22) Filed: Mar. 5, 2019

(65) Prior Publication Data
US 2019/0295876 A1 Sep. 26, 2019

(30) Foreign Application Priority Data
Mar. 23, 2018 (JP) .............................. JP2018-056769

(51) Int. Cl.
*H01L 21/683* (2006.01)
*H01J 37/32* (2006.01)
*H01L 21/687* (2006.01)

(52) U.S. Cl.
CPC .... *H01L 21/6833* (2013.01); *H01J 37/32642* (2013.01); *H01J 37/32724* (2013.01); *H01L 21/68735* (2013.01)

(58) Field of Classification Search
CPC ................ H01L 21/6833; B23Q 3/154; H01J 37/32642; H01J 37/32724; H01J 2237/002
USPC ................................................... 156/345.51
See application file for complete search history.

(56) References Cited

U.S. PATENT DOCUMENTS

| 6,261,659 | B1* | 7/2001 | Fletcher | B29C 65/56 428/58 |
| 8,542,474 | B2 | 9/2013 | Yonekura et al. | |
| 2005/0042881 | A1* | 2/2005 | Nishimoto | H01L 21/67248 438/710 |
| 2006/0279899 | A1* | 12/2006 | Aihara | H01L 21/6831 361/234 |
| 2007/0144442 | A1* | 6/2007 | Migita | C23C 16/4586 118/728 |
| 2009/0243236 | A1* | 10/2009 | Hida | H01L 21/6833 279/128 |
| 2009/0290145 | A1* | 11/2009 | Howard | H01J 37/32642 356/72 |
| 2010/0002355 | A1* | 1/2010 | Morooka | H01L 21/67069 361/234 |

(Continued)

FOREIGN PATENT DOCUMENTS

JP 2011-091297 5/2011

*Primary Examiner* — Charlee J. C. Bennett
(74) *Attorney, Agent, or Firm* — IPUSA, PLLC

(57) ABSTRACT

A substrate holding apparatus includes a baseplate, an adhesive layer disposed on the baseplate, and an electrostatic chuck disposed on the adhesive layer to hold an object, wherein a first side surface of a first portion of the electrostatic chuck is at a same position in a plan view as a second side surface of a second portion of the baseplate, the first portion being in contact with a first face of the adhesive layer, the second portion being in contact with a second face of the adhesive layer, wherein the adhesive layer has a protruding part extending outwardly from the first side surface and the second side surface, and wherein the first face and the second face are flat planes extending from an inside of the first side surface and the second side surface to an outside of the first side surface and the second side surface.

4 Claims, 6 Drawing Sheets

(56) References Cited

U.S. PATENT DOCUMENTS

| | | | | |
|---|---|---|---|---|
| 2010/0078899 A1* | 4/2010 | Povolny | ............ | H01L 21/67069 |
| | | | | 279/128 |
| 2013/0286533 A1* | 10/2013 | Takasaki | ........... | H01L 21/68721 |
| | | | | 361/234 |
| 2015/0187614 A1* | 7/2015 | Gaff | .................. | H01J 37/32513 |
| | | | | 438/5 |
| 2016/0379806 A1* | 12/2016 | Xu | .................... | H01J 37/32513 |
| | | | | 156/280 |
| 2017/0338140 A1* | 11/2017 | Pape | ................ | H01L 21/68735 |
| 2020/0013659 A1* | 1/2020 | Hori | ................. | H01L 21/68785 |
| 2020/0273680 A1* | 8/2020 | Koiwa | ............ | H01J 37/32642 |

* cited by examiner

SUBSTRATE HOLDING APPARATUS

CROSS-REFERENCE TO RELATED APPLICATIONS

The present application is based on and claims priority to Japanese Patent Application No. 2018-056769 filed on Mar. 23, 2018, with the Japanese Patent Office, the entire contents of which are incorporated herein by reference.

FIELD

The disclosures herein relate to a substrate holding apparatus.

BACKGROUND

A film deposition apparatus (e.g., a chemical vapor deposition apparatus, a physical vapor deposition apparatus, or the like) and a plasma etching apparatus are used in the process of manufacturing a semiconductor device such as an IC (integrated circuit) or an LSI (large scale integration). These apparatuses have a stage for holding a wafer in place with high accuracy in a vacuum processing chamber. An example of such a stage is a substrate holding apparatus which clamps a wafer with an electrostatic chuck that is attached to a baseplate via an adhesive layer (see Patent Document 1, for example).

A baseplate is generally made of a metal, and an electrostatic chuck is generally made of a ceramic. They have significantly different linear expansion coefficients. Because of this, application of heat to the substrate holding apparatus creates the risk of cracking or peeling at the adhesive layer.

Accordingly, there may be a need to provide a substrate holding apparatus which has a reduced risk of cracking or peeling at the adhesive layer that bonds the electrostatic chuck to the baseplate.

RELATED-ART DOCUMENTS

Patent Document

[Patent Document 1] Japanese Patent Application Publication No. 2011-091297

SUMMARY

According to an aspect of the embodiment, a substrate holding apparatus includes a baseplate, an adhesive layer disposed on the baseplate, and an electrostatic chuck disposed on the adhesive layer to hold an object, wherein a first side surface of a first portion of the electrostatic chuck is at a same position in a plan view as a second side surface of a second portion of the baseplate, the first portion being in contact with a first face of the adhesive layer, the second portion being in contact with a second face of the adhesive layer, wherein the adhesive layer has a protruding part extending outwardly from the first side surface and the second side surface, and wherein the first face and the second face of the adhesive layer are flat planes extending from an inside of the first side surface and the second side surface to an outside of the first side surface and the second side surface.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

In the following, embodiments will be described by referring to the accompanying drawings. In these drawings, the same elements are referred to by the same references, and a duplicate description thereof may be omitted.

First Embodiment

[Structure of Substrate Holding Apparatus]

Figure 1:
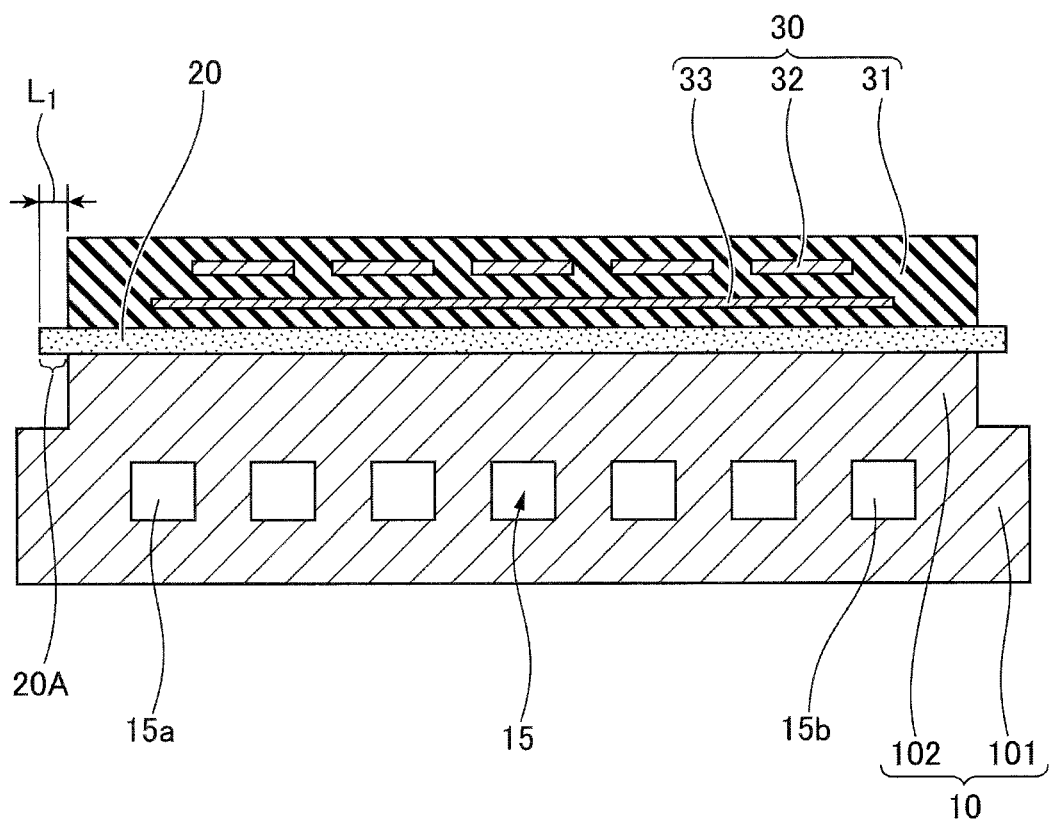
FIG. 1 is a cross-sectional view providing a schematic illustration of a substrate holding apparatus according to a first embodiment.

FIG. 1 is a cross-sectional view providing a schematic illustration of a substrate holding apparatus according to a first embodiment. As illustrated in FIG. 1, a substrate holding apparatus 1 includes a baseplate 10, an adhesive layer 20, and an electrostatic chuck 30 as main components.

The baseplate 10 serves to support the electrostatic chuck 30. The baseplate 10 includes a generally disk-shaped lower part 101 and a generally disk-shaped upper part 102 that is substantially concentric with the lower part 101. The upper part 102, which has a smaller diameter than the lower part 101, extends upwardly from the lower part 101. The lower part 101 and the upper part 102 may be formed as a unitary, seamless structure.

The thickness of the baseplate 10 (i.e., the total thickness of the lower part 101 and the upper part 102) may approximately be 20 mm to 50 mm, for example. The baseplate 10, which may be made of aluminum or an aluminum alloy, for example, may serve as an electrode or the like for controlling plasma. Supplying a predetermined amount of high-frequency electric power to the baseplate 10 enables the control of energy with which generated plasma ions impact a wafer held on the electrostatic chuck 30, thereby achieving an efficient etching process.

The baseplate 10 may have a water pathway disposed therein. The water pathway 15 has a coolant-water inlet 15a at one end and a coolant-water outlet 15b at the other end. The water pathway 15 is connected to a coolant water control apparatus (not shown) provided outside the substrate holding apparatus 1. The coolant water control apparatus (not shown) feeds coolant water into the water pathway 15 at the coolant-water inlet 15a, and receives coolant water discharged from the coolant-water outlet 15b. Circulating coolant water through the water pathway 15 to cool the baseplate 10 causes a wafer held on the electrostatic chuck 30 to be cooled. The baseplate 10 may have a gas pathway or the like for conducting inert gas that cools a wafer held on the electrostatic chuck 30, in addition to or in place of the water pathway 15.

The electrostatic chuck 30 is fixedly attached to the baseplate 10 through the adhesive layer 20. The adhesive layer 20 will be described later. The electrostatic chuck 30 serves to attract and hold a wafer that is an object to be held. The diameter of the wafer that is an object to be held by the electrostatic chuck 30 may approximately be 8, 12, or, 18 inches, for example.

The electrostatic chuck 30 includes a support base 31, electrostatic electrodes 32, and a heating element 33. The electrostatic chuck 30 may be a Johnsen-Rahbeck electrostatic chuck. The electrostatic chuck 30 may alternatively be a Coulomb-type electrostatic chuck.

The support base 31 may be made of dielectric material such as ceramics of aluminum oxide ($Al_2O_3$), aluminum nitride (AlN), or the like.

The support base 31 may have a generally disk shape having the same diameter as the upper part 102 of the baseplate 10, for example. The thickness of the support base 31 may approximately be 1 to 10 millimeters, for example. The relative permittivity (1 kHz) of the support base 31 may approximately be 9 to 10, for example.

The electrostatic electrodes 32 are thin-film electrodes that are embedded in the support base 31. The electrostatic electrodes 32 are coupled to a power supply (not shown) provided separately from the substrate holding apparatus 1. Upon receiving a predetermined voltage, the electrostatic electrodes 32 generate an electrostatic-based attracting force with respect to a wafer, thereby causing the wafer to be held down on the electrostatic chuck 30. The attracting force increases as the voltage applied to the electrostatic electrodes 32 increases. The electrostatic electrodes 32 may have either a monopole structure or a dipole structure. Tungsten, molybdenum, or the like may be used as the material of the electrostatic electrodes 32.

The heating element 33 is embedded in the support base 31. Tungsten or the like may be used as the heating element 33. The heating element 33, which is coupled to a control circuit or the like provided separately from the substrate holding apparatus 1, may be used to control the temperature of an object to be held.

A silicone-based adhesive may be used as the adhesive layer 20. The thickness of the adhesive layer 20 may approximately be 1 mm to 3 mm, for example.

The side surface of a portion of the electrostatic chuck 30 (i.e., the side surface of the support base 31), which portion is in contact with the upper face of the adhesive layer 20, is situated at the same position in a plan view (as viewed in the normal direction to the upper face of the support base 31) as the side surface of a portion of the baseplate 10 (i.e., the side surface of the upper part 102), which portion is in contact with the lower face of the adhesive layer 20. The adhesive layer 20 has a protruding part 20A outwardly extending from the side surface of the support base 31 and the side surface of the upper part 102.

The protruding part 20A is an annular portion horizontally extending (in the direction substantially parallel to the upper face of the upper part 102) from the side surface of the support base 31 and the side surface of the upper part 102. Namely, the upper face of the adhesive layer 20 is a flat plane horizontally extending from the inside of the side face of the support base 31 and the side face of the upper part 102 to the outside thereof. Further, the lower face of the adhesive layer 20 is a flat plane horizontally extending from the inside of the side face of the support base 31 and the side face of the upper part 102 to the outside thereof.

In order to form the adhesive layer 20, a silicone resin film or the like may be prepared that has a larger diameter than the upper part 102 of the baseplate 10 and the support base 31, for example. The silicone resin film or the like is then placed between the upper part 102 of the baseplate 10 and the support base 31 and cured. In so doing, pressure may be applied to the adhesive layer 20.

Alternatively, a silicone resin film or the like may be prepared that has an equal or smaller diameter than the upper part 102 of the baseplate 10 and the support base 31. The silicone resin film or the like is then placed between upper part 102 of the baseplate 10 and the support base 31, and pressure is applied so that the periphery of the adhesive layer 20 is squeezed out horizontally from the side surface of the support base 31 and the side surface of the upper part 102, followed by being cured.

As appropriate, silicone resin or the like in a liquid form or a paste form may be used in place of the silicon resin film or the like.

Figure 2A:
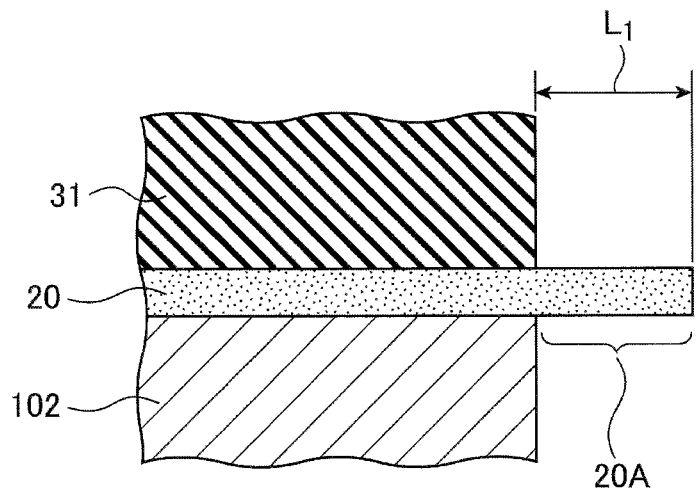
FIGS. 2A through 2C are drawings illustrating advantages provided by the protruding part of the adhesive layer.
Figure 2B:
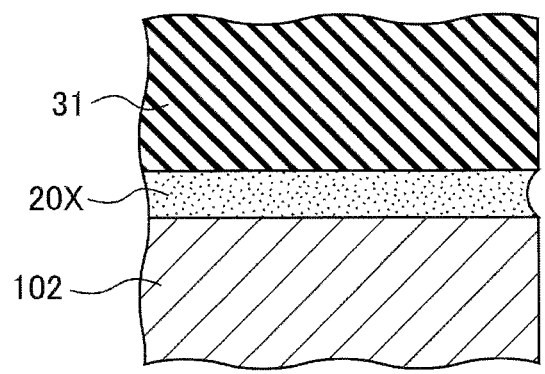
Figure 2C:
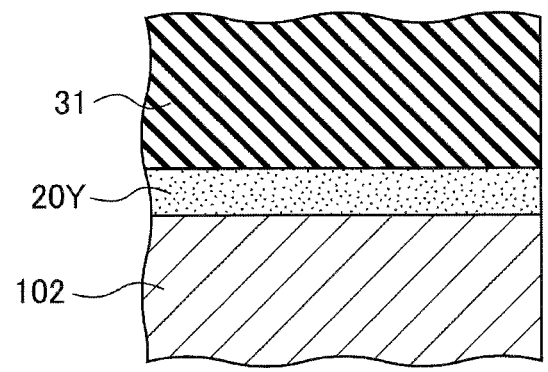

FIGS. 2A through 2C are drawings illustrating advantages provided by the protruding part of the adhesive layer. FIG. 2A is an enlarged cross-sectional view of part of the adhesive layer around the protruding part 20A. FIG. 2B is an enlarged cross-sectional view of a periphery part of an adhesive layer 20X according to a first comparative example where the edge surface of the adhesive layer 20X is recessed relative to the side surface of the support base 31 and the side surface of the upper part 102. FIG. 2C is an enlarged cross-sectional view of a periphery part of an adhesive layer 20Y according to a second comparative example where the edge surface of the adhesive layer 20Y is substantially flush with the side surface of the support base 31 and the side surface of the upper part 102.

Provision of the protruding part 20A of the adhesive layer 20 as illustrated in FIG. 2A causes stress applied to the adhesive layer 20 to be smaller than in the case of FIG. 2B and FIG. 2C when heat is applied to the substrate holding apparatus 1. As a result, the risk of creating cracking or peeling in the adhesive layer 20 can be reduced. In particular, the length $L_1$ of the protruding part 20A protruding from the side surface of the support base 31 and the side surface of the upper part 102 may be set greater than or equal to half the thickness of the adhesive layer 20, which is preferable from the viewpoint of stress reduction.

<Simulation>

Figure 3A:
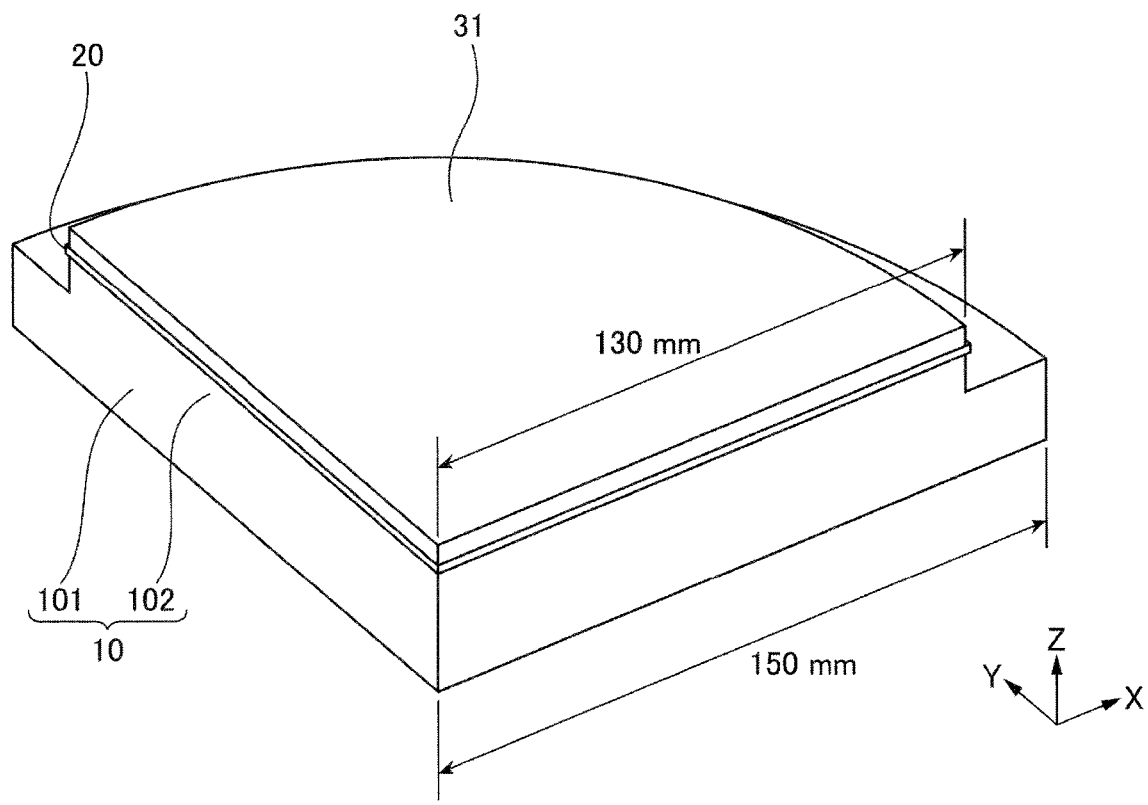
FIGS. 3A and 3B are drawings illustrating a simulation model.
Figure 3B:
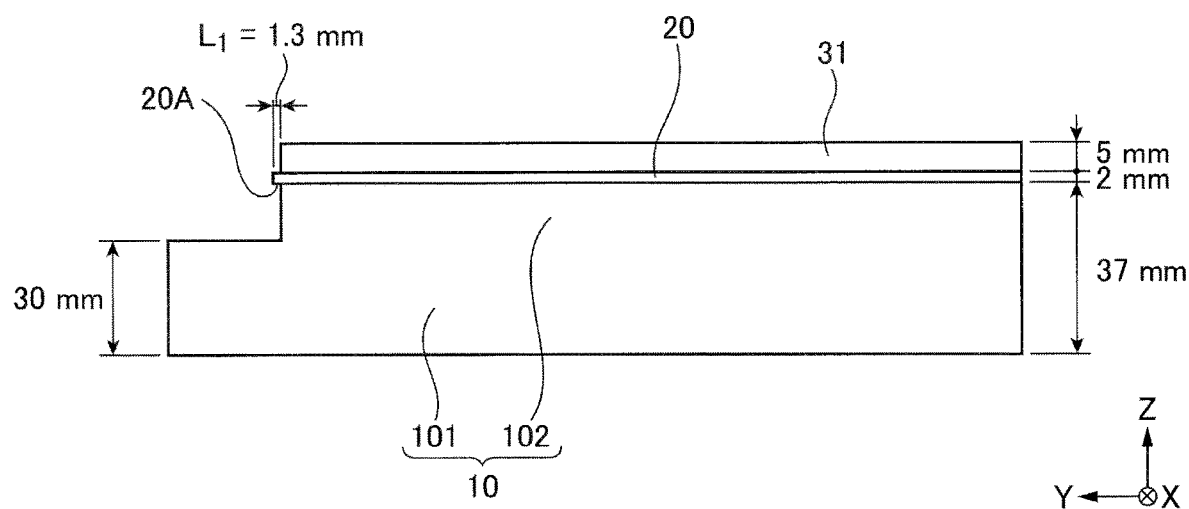

A simulation regarding stress created in the adhesive layer was conducted. The simulation was conducted with respect to a quarter-part model of the actual substrate holding apparatus as illustrated in FIG. 3A and FIG. 3B. FIG. 3A is an axonometric view of the simulation model, and FIG. 3B is a side elevation view of the simulation model as viewed in the X direction.

As illustrated in FIG. 3A and FIG. 3B, the radius of the lower part 101 of the baseplate 10 was 150 mm, and the radius of the upper part 102 of the baseplate 10 was 130 mm, with the radius of the support base 31 being 130 mm. Further, the thickness of the lower part 101 of the baseplate 10 was 30 mm, and the total thickness of the baseplate 10 (i.e., the sum of the thickness of the lower part 101 and the thickness of the upper part 102) was 37 mm. The thickness of the support base 31 was 5 mm. The thickness of the adhesive layer 20 was 2 mm. The protruding length $L_1$ of the protruding part 20A was 1.3 mm, so that the radius of the adhesive layer 20 is 131.3 mm.

Young's moduli, Poisson ratios, and linear expansion coefficients used in the simulation with respect to the baseplate 10 (i.e., the lower part 101 and the upper part 102), the support base 31, and the adhesive layer 20 were set as illustrated in Table 1. Simulation was conducted to derive stress created in the adhesive layer when temperature was lowered to 25 degrees Celsius where the stress free temperature was set at 170 degrees Celsius (temperature load: 145 degrees Celsius).

TABLE 1

|  | Support Base | Adhesive Layer | Baseplate |
|---|---|---|---|
| Young's modulus [MPa] | $3.29 \times 10^5$ | 15 | 71000 |
| Poisson Ratio | 0.23 | 0.3 | 0.34 |
| Linear Expansion Coefficient [/° C.] | $7.1 \times 10^{-6}$ | 0.0002 | $2.36 \times 10^{-5}$ |

Simulation was also conducted with respect to the comparative-example structure illustrated in FIG. 2C that does not have the protruding part 20A. The measurements of the comparative-example structure were the same as those illustrated in FIG. 3A and FIG. 3B, except that the adhesive layer 20Y did not have the protruding part 20A. The same conditions as illustrated in Table 1 were used for the comparative example.

Figure 4A:
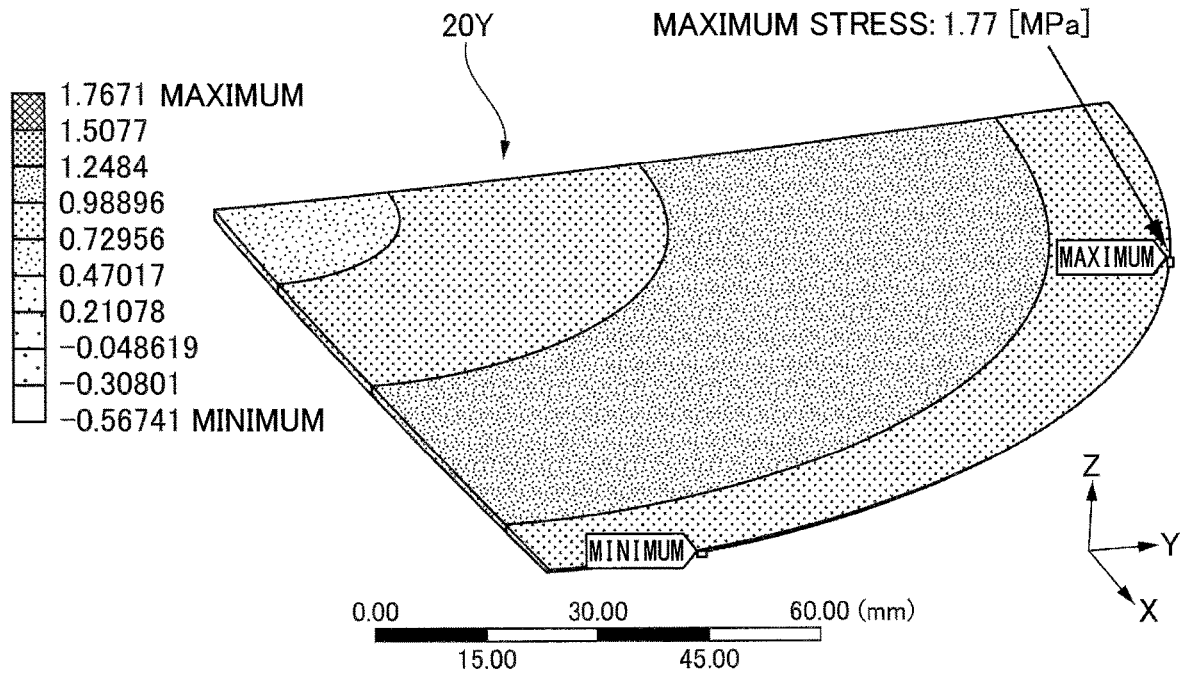
FIGS. 4A and 4B are drawings illustrating simulation results.
Figure 4B:
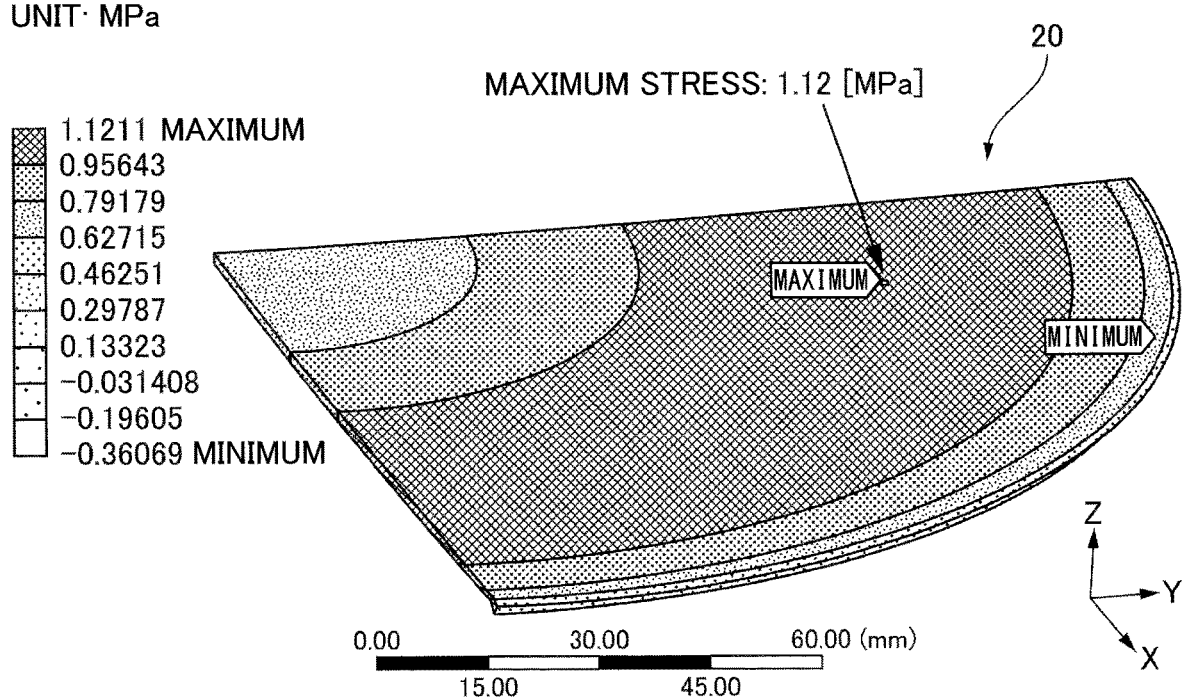

FIGS. 4A and 4B are drawings illustrating simulation results. FIG. 4A illustrates the results obtained for the adhesive layer 20Y of the comparative example, and FIG. 4B illustrates the results obtained for the adhesive layer 20 of the present embodiment. FIG. 4A and FIG. 4B illustrate only the adhesive layers.

The adhesive layer 20Y illustrated in FIG. 4A has the maximum stress point at the perimeter thereof, with the value of the maximum stress being 1.77 MPa. In contrast, the adhesive layer 20 illustrated in FIG. 4B has the maximum stress point at a distance of approximately 40 mm from the perimeter thereof, with the value of the maximum stress being 1.12 MPa.

It was thus confirmed that provision of the protruding part 20A of the adhesive layer 20 causes the stress applied to the adhesive layer 20 to be smaller than the stress observed in the case of no protruding part 20A when heat is applied to the substrate holding apparatus 1. Moreover, the provision of the protruding part 20A of the adhesive layer 20 causes the maximum stress point to be shifted toward the center and away from the perimeter of the adhesive layer 20, thereby preventing cracking and peeling, which are more likely to occur at the perimeter of the adhesive layer 20.

Second Embodiment

The second embodiment is directed to an example of a substrate holding apparatus having a focus ring. In connection with the second embodiment, a description of the same or similar constituent elements as those of the previously provided descriptions may be omitted as appropriate.

Figure 5:
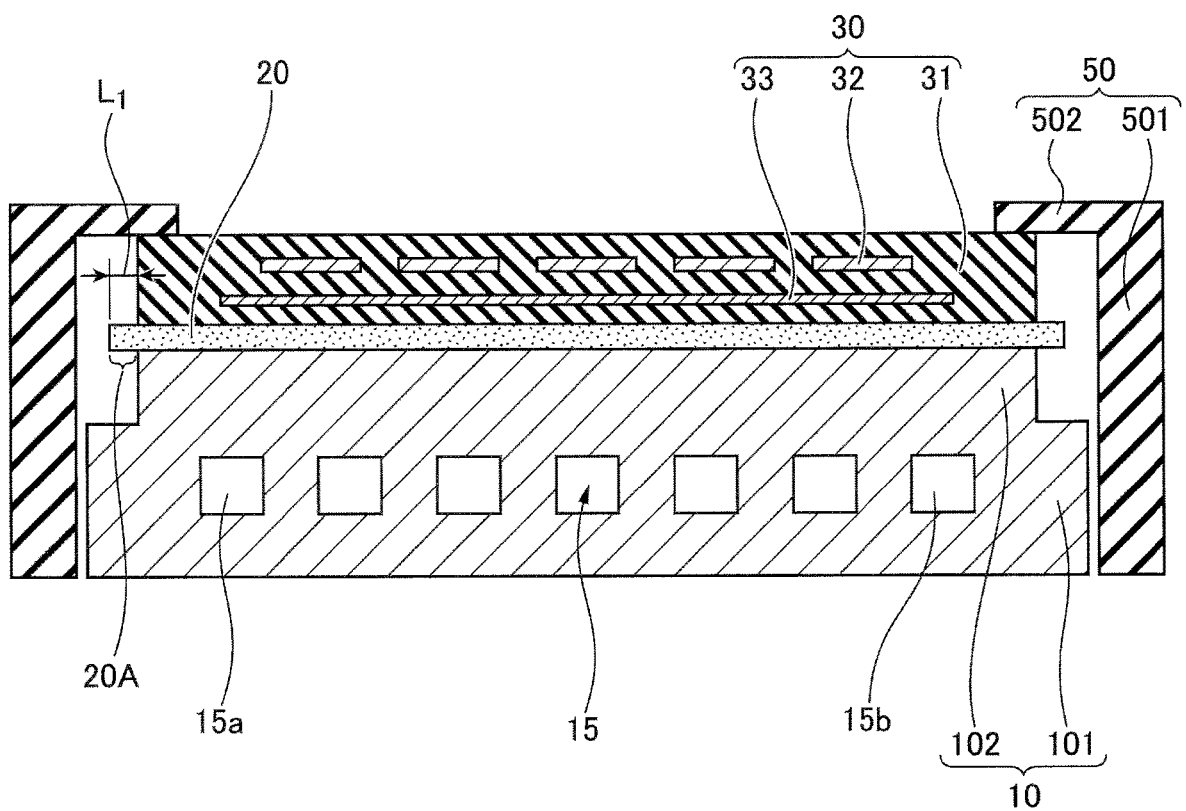
FIG. 5 is a cross-sectional view illustrating a schematic example configuration of a substrate holding apparatus according to a second embodiment.

FIG. 5 is a cross-sectional view illustrating a schematic example configuration of a substrate holding apparatus according to a second embodiment. In FIG. 5, a substrate holding apparatus differs from the substrate holding apparatus 1 (see FIG. 1) in that a focus ring 50 is additionally provided.

The focus ring 50 includes a tubular main part 501 protecting the side surface of the baseplate 10, the protruding part 20A of the adhesive layer 20, and the side surface of the electrostatic chuck 30 (i.e., the side surface of the support base 31), and also includes an extending part 502 that is an annular part extending from the top of the main part 501 toward and over the upper-face perimeter of the electrostatic chuck 30 (i.e., the upper-face perimeter of the support base 31). The main part 501 and the extending part 502 may be a unitary, seamless structure.

The focus ring 50 may be fixedly mounted to the baseplate 10 or to the support base 31 through an engagement member such as bolts or screws or through an adhesive. The focus ring 50 may be made of a material having higher plasma resistivity than the adhesive layer 20 and the support base 31, for example. The material of the focus ring 50 may be silicon, quartz, ceramics, fluoride-containing resin, or the like.

Provision of the focus ring 50 serves to protect the protruding part 20A of the adhesive layer 20 from plasma.

First Variation of Second Embodiment

The first variation of the second embodiment is directed to another example of a substrate holding apparatus having a focus ring. In connection with the first variation of the second embodiment, a description of the same or similar constituent elements as those of the previously provided descriptions may be omitted as appropriate.

Figure 6:
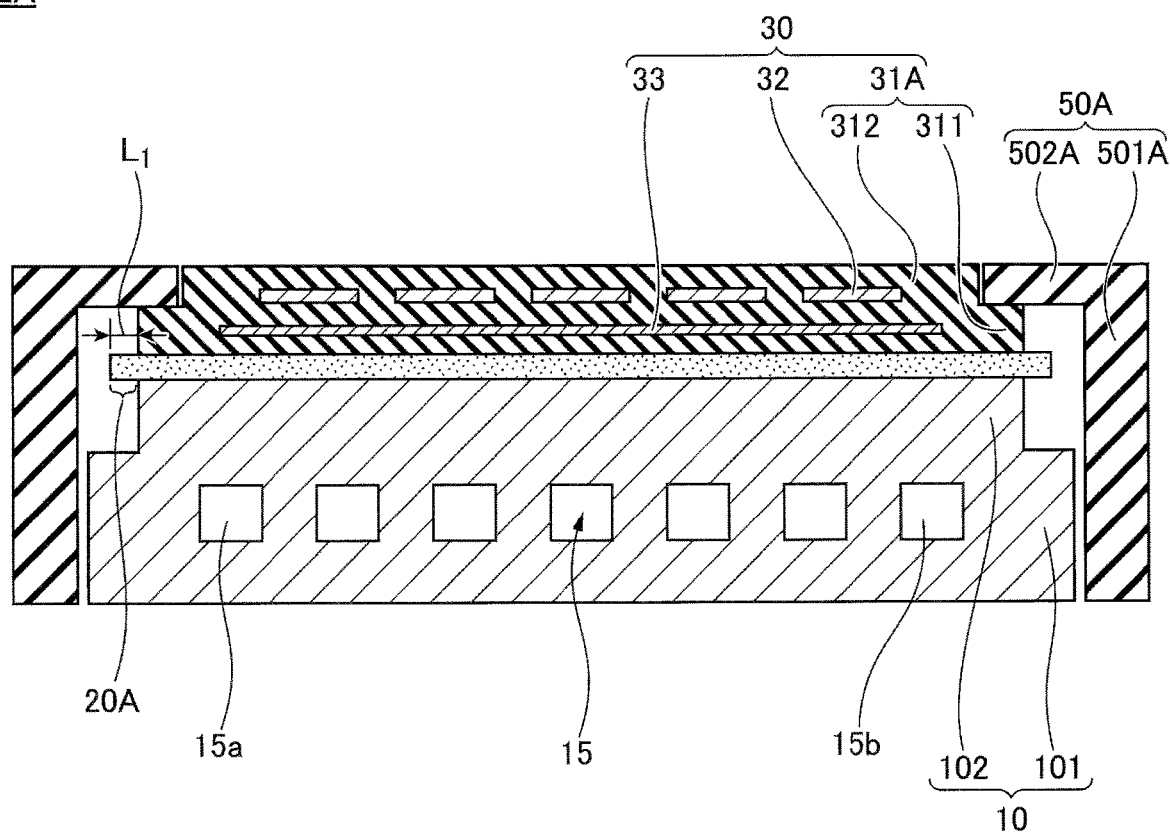
FIG. 6 is a cross-sectional view illustrating a schematic example configuration of a substrate holding apparatus according to a first variation of the second embodiment.

FIG. 6 is a cross-sectional view illustrating a schematic example configuration of a substrate holding apparatus according to a first variation of the second embodiment. A substrate holding apparatus 2A illustrated in FIG. 6 differs from the substrate holding apparatus 2 (see FIG. 5) in that the support base 31 and the focus ring 50 are replaced with a support base 31A and a focus ring 50A.

The support base 31A includes a substantially disk-shaped lower part 311 and a substantially disk-shaped upper part 312 having a smaller diameter than the lower part 311. The upper part 312, which is situated on and concentric with the lower part 311, extends upwardly from the lower part 311 such as to expose an annular perimeter area of the lower part 311. The lower part 311 and the upper part 312 may be formed as a unitary, seamless structure.

The lower part 311 of the support base 31A may have the same diameter as the upper part 102 of the baseplate 10, for example. The material and thickness of the support base 31A (i.e., the total thickness of the lower part 311 and the upper part 312) may be the same as the material and thickness of the support base 31.

The focus ring 50A includes a tubular main part 501A protecting the side surface of the baseplate 10, the protruding part 20A of the adhesive layer 20, and the side surface of the electrostatic chuck 30 (i.e., the side surface of the support base 31A), and also includes an extending part 502A that is an annular part extending from the top of the main part 501A toward and over the upper-face perimeter of the lower part 311 of the support base 31A. The main part 501A and the extending part 502A may be a unitary, seamless structure. The upper face of the extending part 502A may be flush with the upper face of the upper part 312 of the support base 31A, or may be situated below the upper face of the upper part 312 of the support base 31A.

The focus ring 50A may be fixedly mounted to the baseplate 10 or to the support base 31A through an engagement member such as bolts or screws or through an adhesive. The focus ring 50A may be made of a material having higher plasma resistivity than the adhesive layer 20 and the support base 31A, for example. The material of the focus ring 50A may be silicon, quartz, ceramics, fluoride-containing resin, or the like.

Provision of the focus ring 50A serves to protect the protruding part 20A of the adhesive layer 20 from plasma.

Further, provision of a step formed by the lower part 311 and the upper part 312 on the side surface of the support base 31A allows the upper face of the extending part 502A of the focus ring 50A to avoid projecting above the upper face of the upper part 312 of the support base 31A. This allows an object to be readily placed on the upper face of the upper part 312 of the support base 31A.

Although a description has been given with respect to preferred embodiments and the like, the present invention is not limited to these embodiments and the like, but various variations and modifications may be made to these embodiments and the like without departing from the scope of the present invention.

The object to be held on the substrate holding apparatus is not limited to a semiconductor wafer (i.e., silicon wafer or the like), and may as well be a glass substrate or the like that is used in the process of manufacturing a liquid crystal display panel or the like, for example.

According to at least one embodiment, a substrate holding apparatus has a reduced risk of cracking or peeling at the adhesive layer that bonds the electrostatic chuck to the baseplate.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A substrate holding apparatus, comprising:
   a baseplate;
   an adhesive layer disposed on the baseplate; and
   an electrostatic chuck disposed on the adhesive layer to hold an object,
   wherein a first lateral surface of a first portion of the electrostatic chuck is at a same position in a plan view as a second lateral surface of a second portion of the baseplate, the first portion being in contact with a first face of the adhesive layer, the second portion being in contact with a second face of the adhesive layer,
   wherein an outer perimeter portion of the adhesive layer extends outwardly from the first lateral surface and the second lateral surface, such that the first face of the adhesive layer is partially in contact with the electrostatic chuck and partially exposed beyond the first lateral surface without being in contact with the electrostatic chuck, and the second face of the adhesive layer is partially in contact with the baseplate and partially exposed beyond the second lateral surface without being in contact with the baseplate, and
   wherein the first face and the second face of the adhesive layer are flat planes extending from an inside of the first lateral surface and the second lateral surface to an outside of the first lateral surface and the second lateral surface.

2. The substrate holding apparatus as claimed in claim 1, further comprising a focus ring covering the first lateral surface, the second lateral surface, and the outer perimeter portion.

3. The substrate holding apparatus as claimed in claim 2, wherein the focus ring includes a tubular part covering the first lateral surface, the second lateral surface, and the outer perimeter portion, and includes an annular extending part extending from an upper portion of the tubular part toward and on an upper-face perimeter of the electrostatic chuck.

4. The substrate holding apparatus as claimed in claim 2, wherein the first portion of the electrostatic chuck is a first disk-shaped portion in contact with the first face of the adhesive layer, the electrostatic chuck includes a second disk-shaped portion that is situated on the first disk-shaped portion to expose an annular perimeter area of the first disk-shaped portion, and
   wherein the focus ring includes a tubular part covering the first lateral surface, the second lateral surface, and the outer perimeter portion, and includes an annular extending part extending from an upper portion of the tubular part toward and on a perimeter of the first disk-shaped portion.

* * * * *